United States Patent
Chen

(10) Patent No.: US 7,843,368 B2
(45) Date of Patent: Nov. 30, 2010

(54) PROGRAMMABLE SETTLING FOR HIGH SPEED ANALOG TO DIGITAL CONVERTER

(75) Inventor: Chun-Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/637,800

(22) Filed: Dec. 13, 2006

(65) Prior Publication Data

US 2007/0132627 A1 Jun. 14, 2007

Related U.S. Application Data

(60) Provisional application No. 60/750,044, filed on Dec. 14, 2005.

(51) Int. Cl.
*H03M 1/10* (2006.01)
(52) U.S. Cl. .................. 341/120; 438/239; 257/296
(58) Field of Classification Search ......... 341/120–155; 438/238–239; 257/296, 300
See application file for complete search history.

(56) References Cited

U.S. PATENT DOCUMENTS

| | | | |
|---|---|---|---|
| 3,651,517 A * | 3/1972 | Kurek et al. ............... 341/136 |
| 3,982,241 A | 9/1976 | Lipcon |
| 5,732,276 A | 3/1998 | Komatsu et al. |
| 5,783,977 A * | 7/1998 | Chethik ....................... 333/174 |
| 5,818,370 A | 10/1998 | Sooch et al. |
| 5,914,638 A | 6/1999 | He |
| 6,348,886 B1 * | 2/2002 | Frank et al. ................. 341/120 |
| 6,392,581 B1 | 5/2002 | Yang |
| 6,525,615 B1 | 2/2003 | Masenas et al. |
| 6,580,324 B2 | 6/2003 | Palaskas et al. |
| 6,603,416 B2 | 8/2003 | Masenas et al. |
| 6,785,381 B2 | 8/2004 | Gartner et al. |
| 6,812,777 B2 * | 11/2004 | Tamura et al. .............. 327/540 |
| 6,963,237 B2 * | 11/2005 | Tamura et al. .............. 327/292 |
| 7,003,023 B2 * | 2/2006 | Krone et al. ................ 375/219 |
| 7,012,463 B2 | 3/2006 | Naim |
| 7,046,179 B1 | 5/2006 | Taft et al. |
| 7,102,555 B2 | 9/2006 | Collins et al. |
| 7,209,172 B2 | 4/2007 | Jelley et al. |
| 7,307,572 B2 | 12/2007 | Garrity et al. |
| 7,456,764 B2 | 11/2008 | Chen |
| 7,466,249 B2 | 12/2008 | Chen |
| 2003/0081706 A1 * | 5/2003 | Ciccarelli et al. ........... 375/350 |
| 2004/0076360 A1 * | 4/2004 | Chen et al. ..................... 385/14 |
| 2005/0123036 A1 * | 6/2005 | Rahman et al. ............. 375/240 |
| 2006/0160511 A1 | 7/2006 | Trichy et al. |
| 2006/0250181 A1 | 11/2006 | Lee et al. |
| 2007/0132617 A1 | 6/2007 | Le |
| 2007/0132625 A1 | 6/2007 | Chen |
| 2007/0132628 A1 | 6/2007 | Chen |
| 2007/0146191 A1 | 6/2007 | Iwata et al. |
| 2007/0152863 A1 | 7/2007 | Le et al. |
| 2008/0129567 A1 | 6/2008 | Lee et al. |
| 2009/0058698 A1 | 3/2009 | Chen |
| 2009/0058699 A1 | 3/2009 | Chen |
| 2009/0058700 A1 | 3/2009 | Chen |

* cited by examiner

*Primary Examiner*—Lam T Mai
(74) *Attorney, Agent, or Firm*—Sterne, Kessler, Goldstein & Fox P.L.L.C.

(57) ABSTRACT

In an embodiment, an apparatus and method reduces a calibration settling time in an analog-to-digital converter (ADC). The ADC has a reference voltage supply. The reference voltage supply has an output. A filter capacitor is coupled to the reference voltage supply output. An isolation transistor is series-coupled between the filter capacitor and ground. The isolation transistor isolates the filter capacitor during calibration of the ADC.

14 Claims, 15 Drawing Sheets

PROGRAMMABLE SETTLING FOR HIGH SPEED ANALOG TO DIGITAL CONVERTER

CROSS REFERENCE TO RELATED APPLICATIONS

This application claims benefit of U.S. Provisional Application No. 60/750,044, filed Dec. 14, 2005, which is incorporated herein by reference in its entirety.

FIELD OF THE INVENTION

The present invention is generally directed to an analog to digital converter (ADC). More particularly, embodiments of the invention relate to an apparatus and method for controlling an ADC settling time.

BACKGROUND OF THE INVENTION

A reference signal for an analog to digital converter (ADC) often becomes marred by noise during the analog to digital conversion process. A filter circuit to shunt the noise to ground can reduce the noise. However, the filter circuit for shunting the noise frequently increases a settling time of the ADC during ADC calibration.

What is needed is an apparatus and method to reduce the settling time of the ADC during ADC calibration as well as overcome other shortcomings noted above.

BRIEF SUMMARY

In an embodiment, a method and apparatus reduces a settling time of an analog to digital converter (ADC) during ADC calibration. An ADC has a reference voltage supply. The reference voltage supply has an output. A filter capacitor is coupled to the reference voltage supply output. An isolation transistor is series-coupled between the filter capacitor and ground. The isolation transistor isolates the filter capacitor during ADC calibration.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
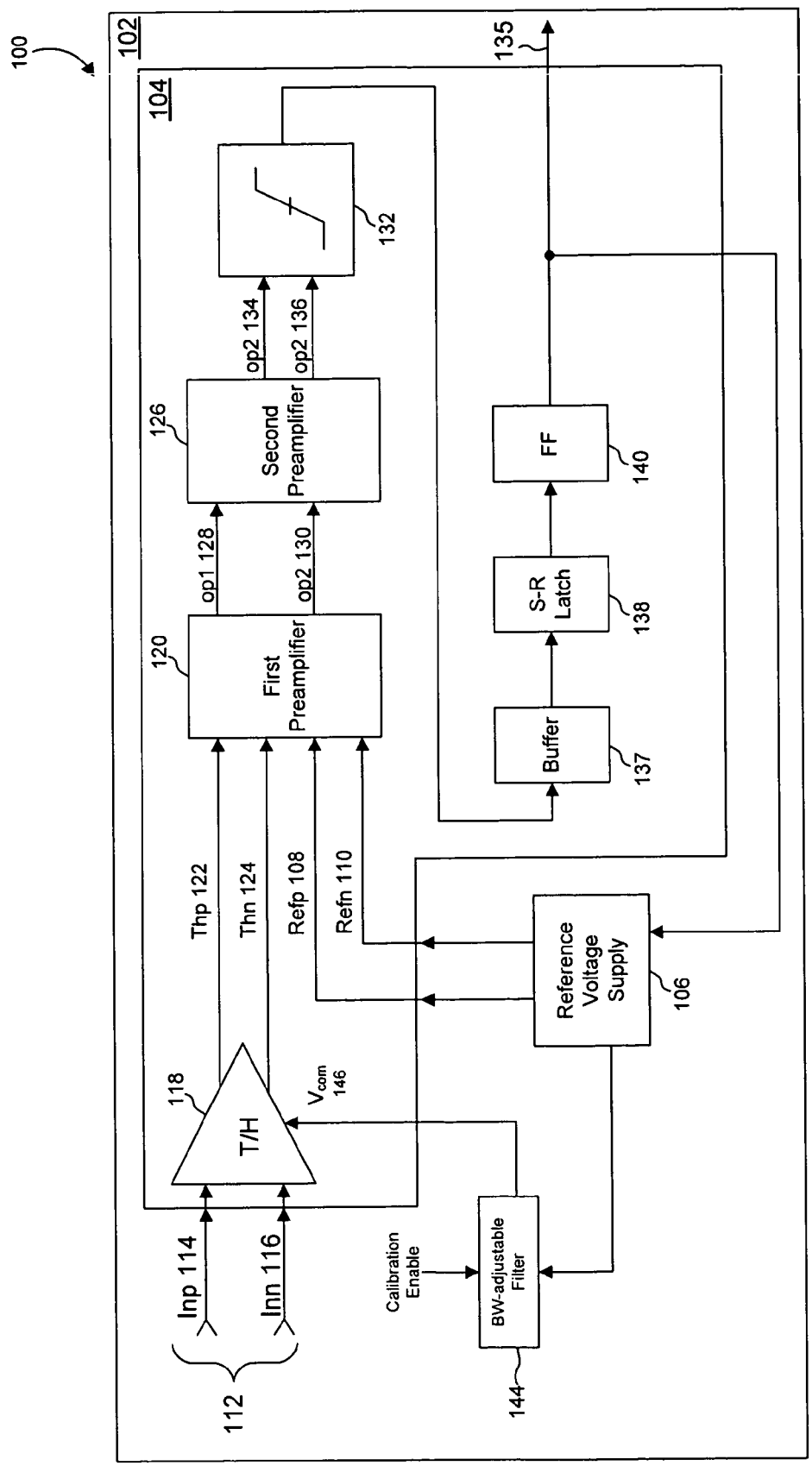
FIG. 1A is a block diagram of an analog-to-digital converter.

Embodiments of the present invention are described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

An embodiment provides an approach to reducing an analog-to-digital converter (ADC) settling time during ADC calibration. FIGS. 1-13, described below, illustrate this approach. This specification discloses one or more embodiments that incorporate the features of this invention. The disclosed embodiment(s) merely exemplify the invention. The scope of the invention is not limited to the disclosed embodiment(s). The invention is defined by the claims.

The embodiment(s) described and references in the specification to "one embodiment," "an embodiment," "an example embodiment," etc., indicate that the embodiment(s) described may include a particular feature, structure, or characteristic. However, every embodiment may not necessarily include the particular feature, structure, or characteristic. Moreover, such phrases are not necessarily referring to the same embodiment. When a particular feature, structure, or characteristic is described in connection with an embodiment, it is understood that it is within the knowledge of one skilled in the art to effect such feature, structure, or characteristic in connection with other embodiments, whether or not explicitly described.

Analog to Digital Conversion Circuit

FIG. 1A illustrates an exemplary analog to digital conversion circuit 100. The conversion circuit 100 is deposited on a substrate 102. The conversion circuit 100 has an analog-to-digital converter (ADC) 104 coupled to a reference voltage supply 106 via a positive reference (Refp) 108 and a negative reference (Refn) 110. The reference voltage supply 106 is coupled to a track-and-hold circuit 118 via a bandwidth-adjustable filter 144. A calibration enable control is coupled to the bandwidth-adjustable filter. The combination of a first preamplifier 120, a second preamplifier 126, and a comparator 132 is a one-bit ADC. The reference voltage supply 106 is a voltage source that supplies the positive reference (Refp) 108 and the negative reference (Refn) 110. The reference voltage supply 106 also supplies a common mode calibration voltage (Vcom) 146 to the track and hold circuit 118 via the bandwidth-adjustable filter 144. Also coupled to the ADC 104 is an ADC input 112. The ADC input 112 has a positive input 114 and a negative input 116. In examples, the ADC 104 is a multi-bit ADC.

The ADC 104 has a track-and-hold circuit 118 coupled to a differential signal input 112 with the positive input 114 and the negative input 116. The track-and-hold circuit 118 is also coupled to the first preamplifier 120 via a positive track-and-hold output (Thp) 122 and a negative track-and-hold output (Thn) 124. The first preamplifier 120 is coupled to the second preamplifier 126 via a positive first preamplifier output (op1) 128 and a negative first preamplifier output (on1) 130. The second preamplifier 126 is coupled to the comparator 132 via a positive second preamplifier output (op2) 134 and a negative second preamplifier output (on2) 136. The comparator 132 is coupled to an optional buffer 137. The buffer 137 is coupled to a set-reset latch 138. The set-reset latch 138 is coupled to a flip-flop 140. The output of the flip-flop 140 is an ADC output 135. The track-and-hold circuit 118, the set-reset latch 138, and/or the flip-flop 140 may be edge-triggered circuits.

The ADC 104 converts the analog ADC input 112 into the digital ADC output 135. The track-and-hold circuit 118 performs tracking and holding of the ADC input 112 to create the positive track-and-hold output (Thp) 122 and the negative track-and-hold output (Thn) 124. The track-and-hold circuit 118 has a track mode and a hold mode. During the track mode, the track-and-hold circuit 118 tracks a signal at the ADC input 112. The output of the track-and-hold circuit 118 substantially equals the differential signal at the ADC input 112 during the track mode. During the hold mode, the track-and-hold circuit 118 holds the output of the track-and-hold circuit 118 at a constant differential voltage substantially equal to that of the ADC input 112 at the moment the hold mode started.

The bandwidth-adjustable filter 144 varies a bandwidth of a calibration signal. During calibration, a high filter bandwidth permits rapid calibration. During analog-to-digital conversion, a low filter bandwidth filters out noise. Thus, bandwidth of the calibration signal is higher during analog-to-digital conversion than it is during calibration. Filter bandwidth may be determined based in part on calibration timing. FIG. 1A illustrates filtering of the common mode voltage calibration signal (Vcom) 146.

Figure 1B:
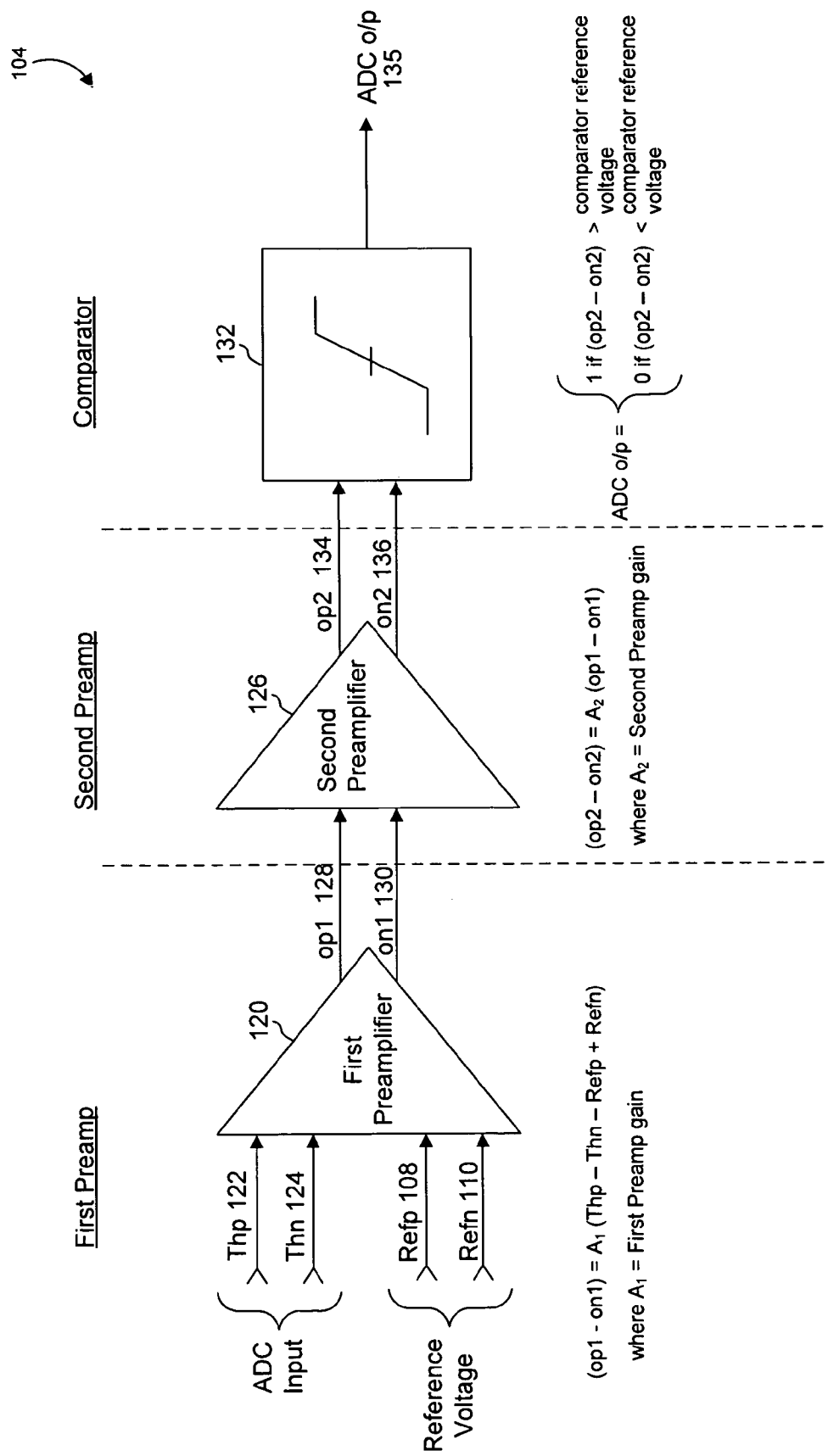
FIG. 1B illustrates operational detail of an analog-to-digital converter.

FIG. 1B illustrates operational detail of the first preamplifier 120, the second preamplifier 126, and the comparator 132. The first preamplifier 120 creates a first differential result by subtracting the negative track-and-hold output (Thn) 124 from the positive track-and-hold output (Thp) 122. The first preamplifier 120 also creates a second differential result by subtracting the negative reference (Refn) 110 from the positive reference (Refp) 108. The first preamplifier 120 creates a third differential result by subtracting the second differential result from the first differential result. Further, the first preamplifier 120 varies a gain of the third differential result. The gain-adjusted third differential result is the positive first preamplifier output (op1) 128 and the negative first preamplifier output (on1) 130. The equation (op1−on1)=$A_1$·(Thp−Thn−Refp+Refn) determines the first preamplifier 120 output, where $A_1$ is the first preamplifier gain.

The second preamplifier 126 amplifies the positive first preamplifier output (op1) 128 and the negative first preamplifier output (on1) 130 to produce the positive second preamplifier output (op2) 134 and the negative second preamplifier output (on2) 136. The equation: (op2−on2)=$A_2$·(op1−on1) determines the second preamplifier output. The variable $A_2$ is the second preamplifier gain.

The positive second preamplifier output (op2) 134 and the negative second preamplifier output (on2) 136 are input to the comparator 132. The comparator 132 compares a difference between the positive second preamplifier output (op2) 134 and the negative second preamplifier output (on2) 136 to a comparator reference voltage. The comparator reference voltage is substantially zero. If the difference is positive relative to the comparator reference voltage, then the ADC output 135 is a logic "high" and/or a digital "1". If the difference is negative relative to the comparator reference voltage, then the ADC output 135 is a logic "low" and/or a digital "−1". The comparator reference voltage may be a voltage other than zero.

As used herein, the terms logic bit, logic signal, and bit are used interchangeably to refer to the same signal. Also, the terms high-level bit, logic "1", high signal, logic high, and logic-one are interchangeable. Further, the terms low-level bit, logic "0", low signal, logic low, and logic-zero are interchangeable.

Referring to FIG. 1A, the buffer 137 buffers the comparator output. The set-reset latch 138 ensures the ADC output 135 is bi-stable. The flip-flop 140 corrects timing errors in the comparator output and provides the ADC output 135.

Figure 2:
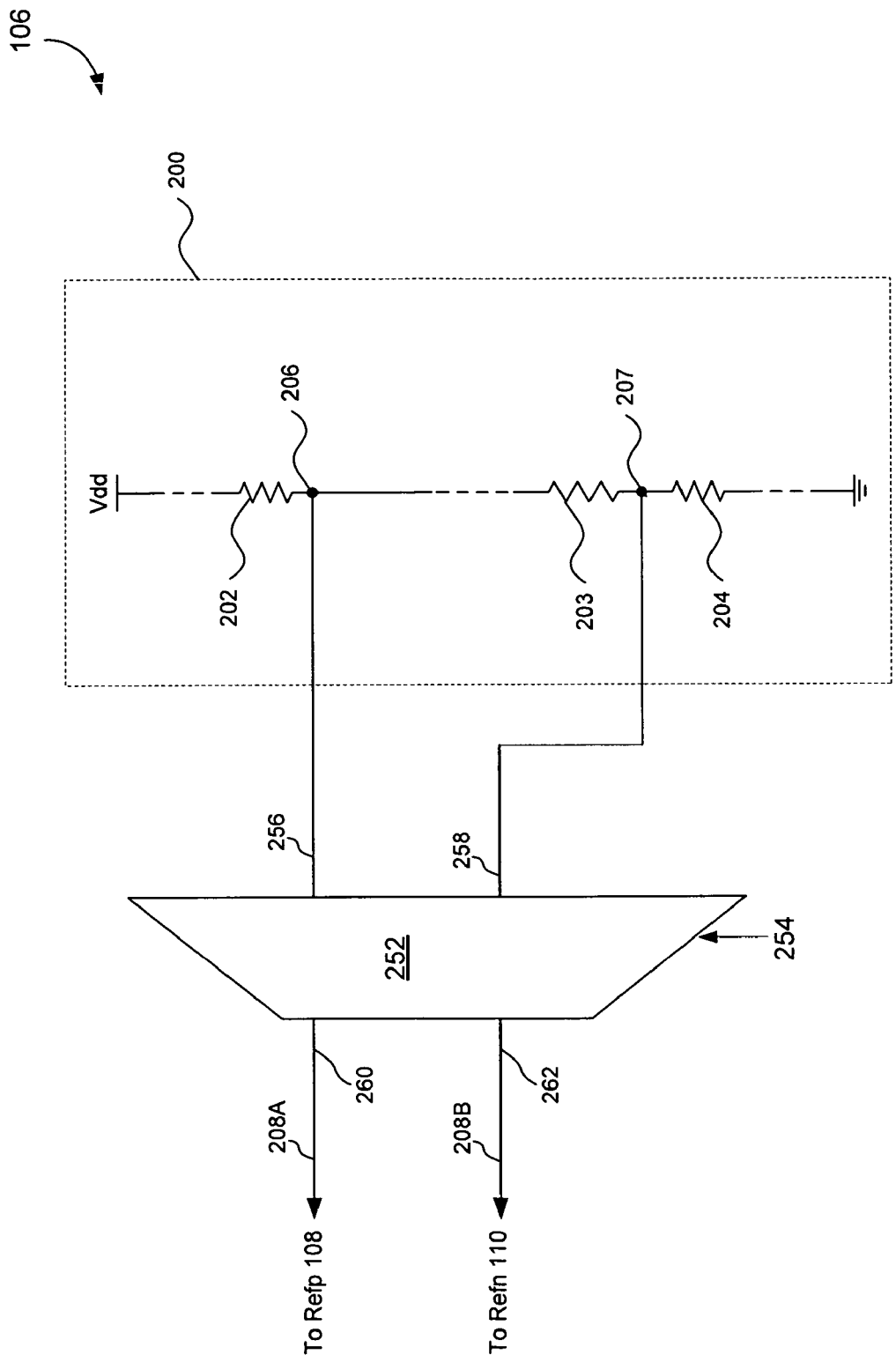
FIG. 2 illustrates a reference voltage supply.

FIG. 2 illustrates an exemplary reference voltage supply 106. The reference voltage supply 106 has a reference ladder 200. The reference ladder 200 has at least a first resistor 202, a second resistor 203, and a third resistor 204 coupled in series via a first node 206 and a second node 207. A multiplexer 252 has a control input 254, a first input 256, a second input 258, a first output 260, and a second output 262. The first node 206 is coupled to the multiplexer first input 256. The second node 207 is coupled to the multiplexer second input 258. Together, the first node 206 and the second node 207A provide a differential voltage. The multiplexer first output 260 provides the first reference voltage supply output 208A. The multiplexer second output 262 provides the second reference voltage supply output 208B. The positive reference (Refp) 108 is coupled to the first reference voltage supply output 208A. The negative reference (Refn) 110 is coupled to the second reference voltage supply output 208B. The reference ladder 200 may have additional series-coupled resistors coupled by additional nodes. The additional nodes are coupled to additional inputs of the multiplexer 252 to provide a variety of voltages for selection by the multiplexer 252. The reference ladder 200 may be coupled between two voltage sources.

The reference ladder 200 divides a voltage, such as Vdd, to provide at least two reference voltages, such as the first input 256 and the second input 258, to the multiplexer 252. The reference ladder 200 may provide a plurality of differential voltages. The multiplexer control 254 controls which multiplexer inputs 256, 258 are selectively coupled to the first reference voltage supply output 208A and the second reference voltage supply output 208B. The multiplexer 252 may selectively couple a differential voltage from a plurality of available differential voltages. The first reference voltage supply output 208A and the second reference voltage supply output 208B may provide a differential voltage. The reference ladder 200 may be coupled between two voltage sources.

ADC Dynamic Power Circuit

Figure 3A:
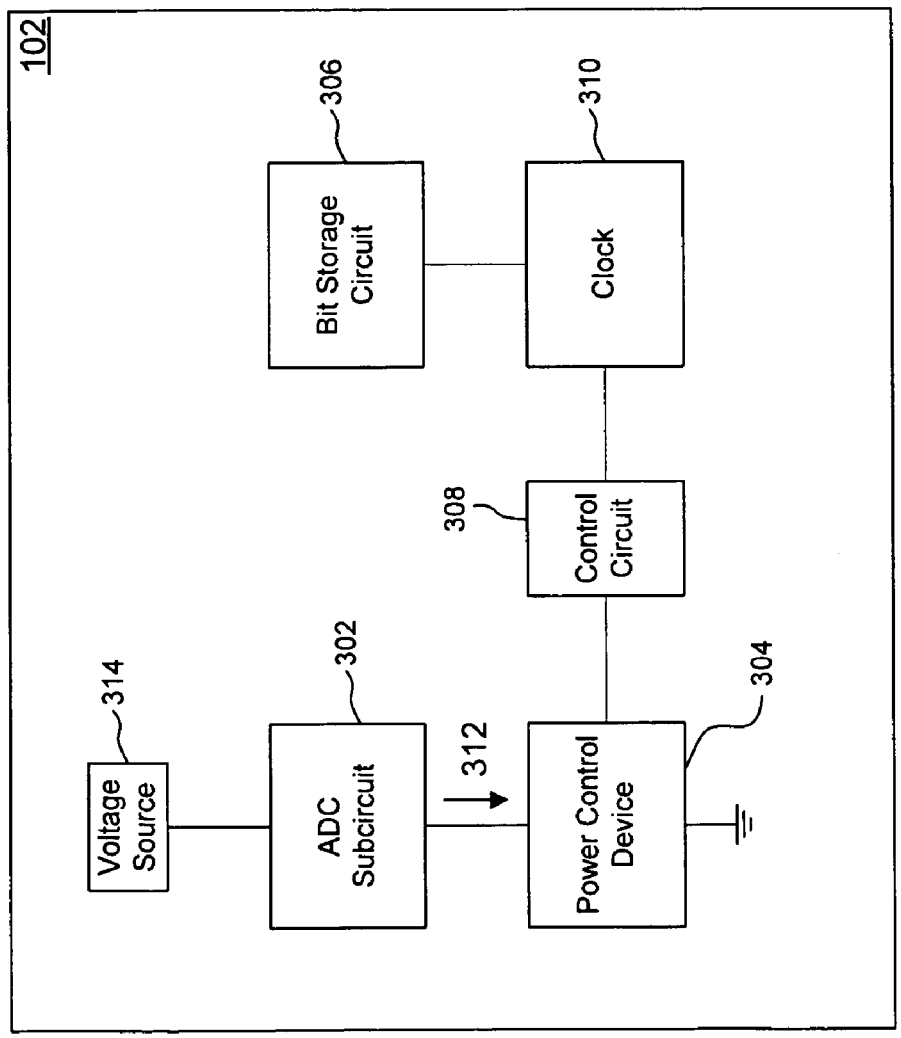
FIG. 3A illustrates an analog-to-digital converter with a dynamic power circuit.

FIG. 3A is an ADC with a dynamic power circuit 300. The dynamic power circuit 300 cuts power to an ADC subcircuit 302 to reduce power consumption of the ADC subcircuit 302. The ADC with a dynamic power circuit 300 is deposited on a substrate 102. The ADC subcircuit 302 is coupled to a power control device 304. The bit storage circuit 306 is coupled to a clock 310. A bit storage circuit 306 is a circuit that maintains a substantially constant bit storage circuit output that is independent of a bit storage circuit input for at least a part of a clock cycle. The clock 310 is also coupled to the power control device 304 via a control circuit 308. The ADC subcircuit 302 is coupled to a voltage source 314. The voltage source 314 may be a power supply voltage such as Vdd. In examples, the control circuit 308 is coupled to a hard drive controller.

The ADC subcircuit 302 may be at least one of the first preamplifier 120, the second preamplifier 126, and the comparator 132. Examples of the bit storage circuit 306 are the flip flop 140 and the set-reset latch 138. Further, the control circuit 308 is the track-and-hold circuit 118, and/or any circuit capable of controlling the power control device 304.

The clock circuit 310 provides a clock signal to the bit storage circuit 306 and the control circuit 308. The bit storage circuit 306 affects at least two operational modes. A first mode is a track mode during which power is conserved. A second mode is a hold mode.

The clock signal, the track-and-hold circuit 118, and/or the bit storage circuit 306 determine, at least in part, mode selection. In the track mode, the bit storage circuit 306 provides a constant output that is independent of an input to the bit storage circuit 306. In the hold mode, change of the bit storage circuit output is enabled. When the bit storage circuit 306 is enabled, the bit storage circuit output is dependent on the bit storage circuit input. The control circuit 308 may determine the mode based on a signal from at least one of the clock circuit 308, the track-and-hold circuit 118, and/or the bit storage circuit 306.

During the track mode, signal processing and other processes performed by the ADC subcircuit 302 have no effect on the bit storage circuit output. Thus, during the track mode, the control circuit 308 issues a control signal to the power control device 304 to reduce a current 312 in the ADC subcircuit 302. Reducing the current 312 in the ADC subcircuit 302 reduces power consumption by the ADC subcircuit 302. The current 312 may be reduced to essentially zero. During the hold mode, processing performed by the ADC subcircuit 302 affects the bit storage circuit output. Thus, the control circuit 308 issues a control signal to the power control device 304 to increase the current 312 to the ADC subcircuit 302 during, and/or prior to, the hold mode.

Figure 3B:
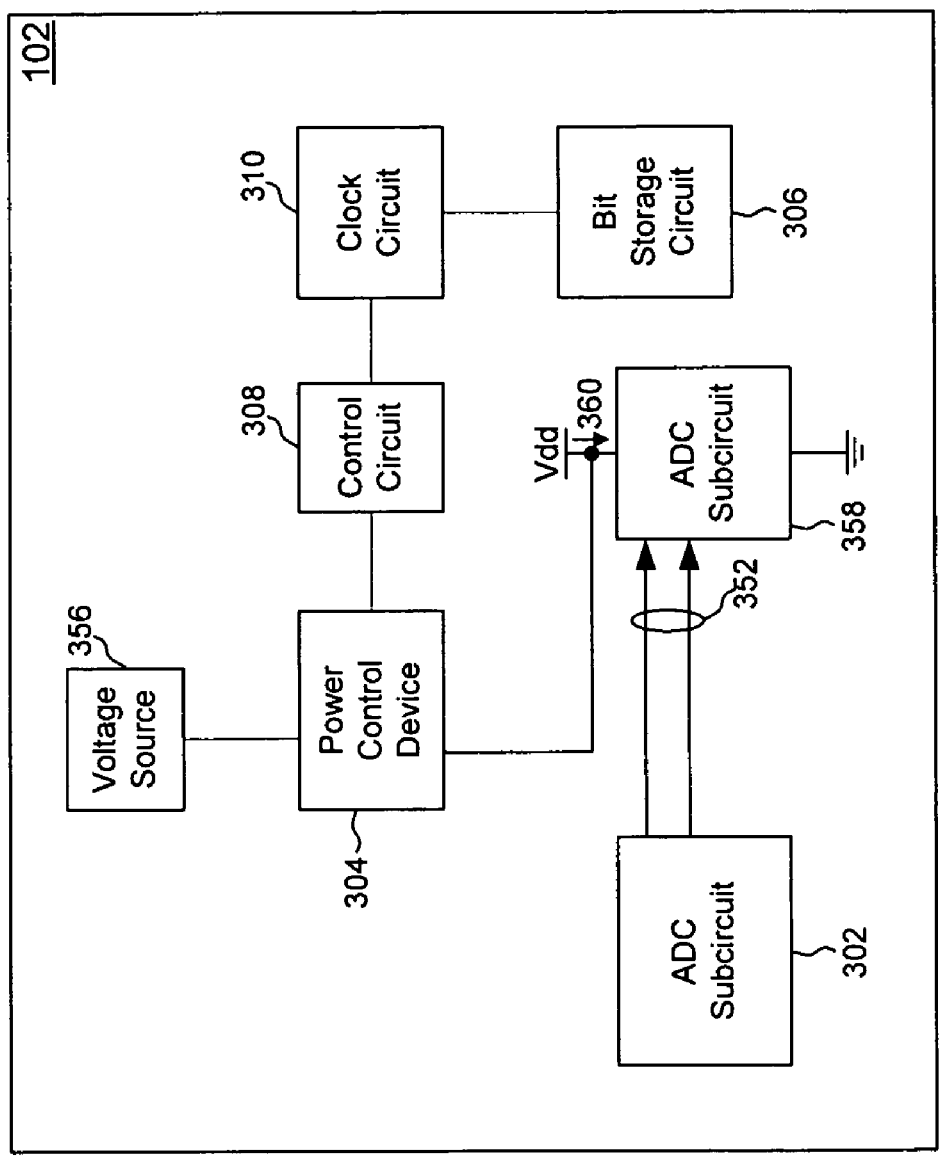
FIG. 3B illustrates an analog-to-digital converter with a dynamic power circuit.

FIG. 3B is an ADC dynamic power circuit 350. The dynamic power circuit 350 shorts an output of the ADC subcircuit 302 to a voltage source to reset the ADC subcircuit output. Resetting the ADC subcircuit output removes inter-symbol interference (ISI). The dynamic power circuit 350 resets an ADC subcircuit output 352 to a differential voltage of zero volts. During the reset phase, the dynamic power circuit 350 also shuts down the ADC subcircuit 302 to save power. The ADC with a dynamic power circuit 350 is deposited on a substrate 102. The ADC subcircuit output 352 is coupled to the power control device 304 and a second ADC subcircuit 358. The power control device 304 is coupled to a voltage source 356. The bit storage circuit 306 is coupled to a clock 310. The clock 310 is coupled to the power control device 304 via a control circuit 308. The voltage source 356 may be Vdd or ground.

Figure 4:
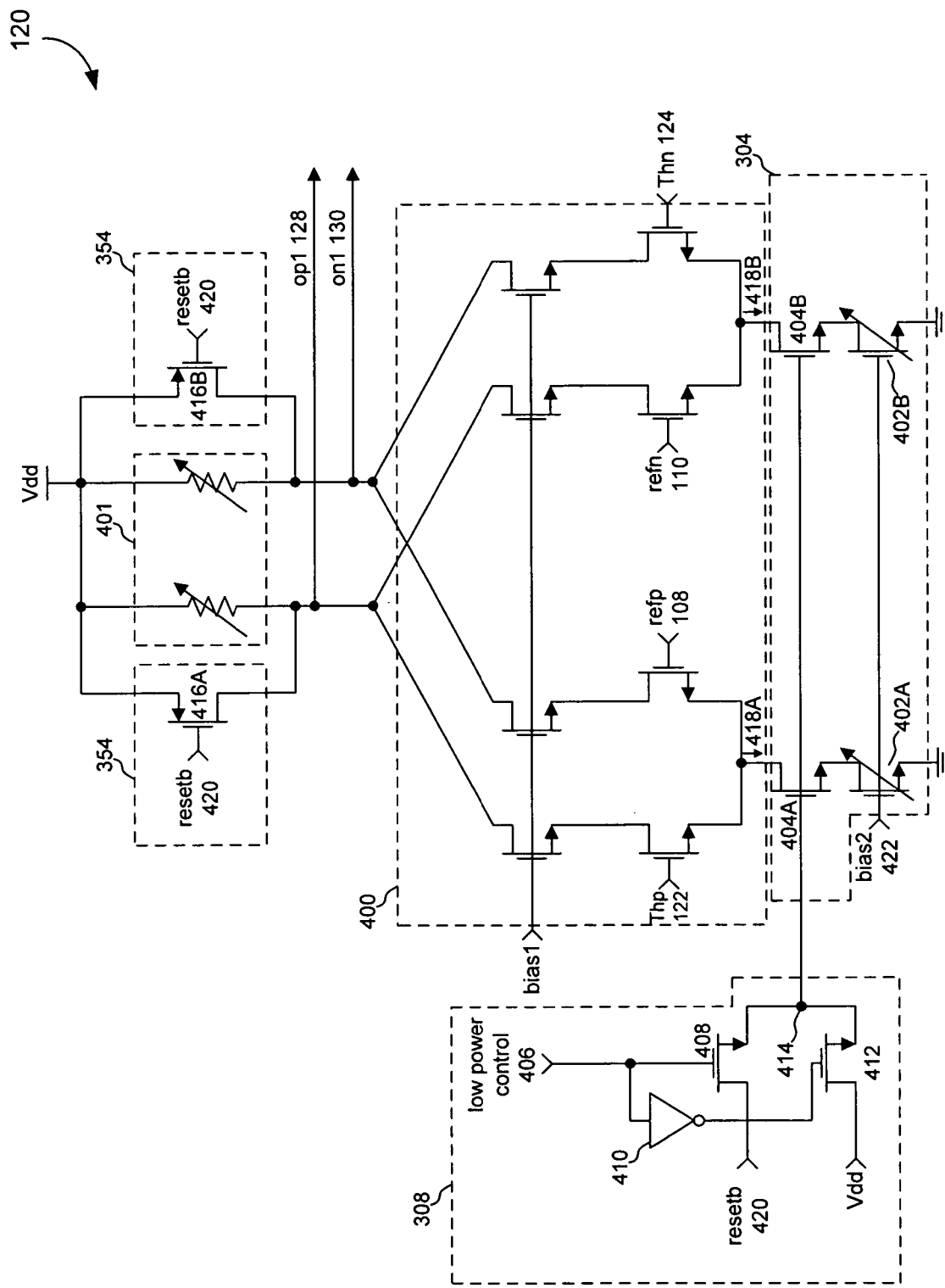
FIG. 4 is a schematic of a preamplifier stage.

FIG. 4 is a schematic of the first preamplifier 120 with a dynamic power circuit. The dynamic power circuit adjusts a gain and a bandwidth in the ADC subcircuit 302 based on clock frequency. The gain and the bandwidth are adjusted via adjusting a first preamplifier load 401 and a pair of bias transistors 402A, 402B. The dynamic power circuit also enables the first preamplifier 120 to amplify during the hold mode. In the track mode, the first preamplifier 120 is disabled and the ADC subcircuit 302 is reset via the control circuit 308, a pair of first preamplifier current control transistors 404A, 404B, and a resetb control 420. The dynamic power circuit cuts power to at least a part of the first preamplifier 120. The dynamic power circuit also shorts an output of the first preamplifier 120 to reset the output of the first preamplifier 120 so that the ADC 104 can always compare the input signal and the reference voltage from the same initial conditions, thus the inter-symbol interference (ISI) may be removed.

The first preamplifier 120 has a differential pair amplifier 400 coupled to the first preamplifier load 401. The differential pair amplifier 400 is an example of the ADC subcircuit 302. The differential pair amplifier 400 is coupled to the pair of bias transistors 402A, 402B via the pair of first preamplifier current control transistors 404A, 404B. The bias transistors 402 and the current control transistors 404 are an example of the power control device 304. The current control transistors 404 are coupled to, and controlled by, the control circuit 308. The control circuit 308 has a low power mode input 406 coupled to control a first control transistor 408 and an inverter 410. An output of the inverter 410 is coupled to control a second control transistor 412. An output of the first control transistor 408 and an output of the second control transistor 412 are both coupled to a control output node 414. The control output node 414 is coupled to control the first preamplifier current control transistors 404. An input of the first control transistor 408 is coupled to a first voltage source, such as the resetb control 420. The resetb control 420, a bias2 control 422, and the low power mode input 406 are examples of outputs of the control circuit 308. An input of the second control transistor 412 is coupled to a second voltage source, such as Vdd. When low power control input 406 is enabled, the preamplifier is in dynamic power mode, that is the first preamplifier 120 will be turned on during the hold mode and will be turned off in track mode through the control signal resetb 402 to switch the current control transistors 404A, 404B. If the low power control input 406 is disabled, the first preamplifier 120 will be on both in track and hold modes.

The resetb control 420 is a signal that is input to the track and hold circuit 118. When the resetb control 420 signal is logic high, the track and hold circuit 118 is in hold mode and the first preamplifier 120 is normal operation mode. The gain and bandwidth of the first preamplifier 120 is controlled by the first preamplifier load 401 and the bias current 422, 402A, 402B depending on the clock frequency, which could change with time. When the resetb control 420 is low, the track and hold circuit is in track mode and the preamplifier is in the reset mode and turned off because the NMOS current control transistors 404A, 404B are off. The first preamplifier 120 is in reset mode because the PMOS shorting transistors 416A, 416B are turned on and both outputs are shorted to Vdd. With both the positive first preamplifier output (op1) 128 and the negative first preamplifier output (on1) 130 shorted to the same voltage source, the differential voltage between the positive first preamplifier output (op1) 128 and the negative first preamplifier output (on1) 130 is zero, thus the first preamplifier 120 is reset. When the analog to digital conversion circuit transitions from track mode to hold mode after being reset, circuits downstream from the first preamplifier 120 start processing from the same post-reset input voltage. The first preamplifier 120 is in off mode because the current control transistors 404A, 404B are off if the low power control 406 is turned on.

When the first preamplifier 120 is in reset mode, the differential output of the differential pair amplifier 400 is substantially zero. The positive first preamplifier output (op1) 128 and the negative first preamplifier output (on1) 130 are coupled to Vdd via a pair of shorting transistors 416A, 416B. The shorting transistors 416 are an example of the power control device 304. The gates of the shorting transistors 416 are coupled to a control circuit 308 and controlled by the resetb control 420. The shorting transistors 416 are turned on by a logic low on the resetb 420 when the first preamplifier 120 is reset.

When the track-and-hold circuit 118 is in the track mode, the control circuit 308 controls the shorting transistors 416 to short the positive first preamplifier output (op1) 128 and the negative first preamplifier output (on1) 130 to Vdd. More specifically, the resetb control 420 is set to a logic low to cause the shorting transistors 416A, 416B to conduct and short the positive first preamplifier output (op1) 128 and the negative first preamplifier output (on1) 130 to Vdd. In the hold mode, the control circuit 308 controls the shorting transistors 416 to isolate the positive first preamplifier output (op1) 128 and the negative first preamplifier output (on1) 130 from Vdd, thus the differential voltage of the ADC subcircuit output 352 is passed to the second ADC subcircuit 358.

In the hold mode, the bias2 422 controls the first preamplifier current control transistors 404 to reduce or increase a pair of differential pair amplifier currents 418A, 418B based on the operating frequency. Together with the control of the first preamplifier load 401, the gain and bandwidth of the first preamplifier 120 can be dynamically optimized to the operating clock frequency.

In the hold mode, a signal on the low power control 406 controls the first control transistor 408 and the second control transistor 412. The inverter 410 inverts the low power control signal 406 so that the first control transistor 408 operates inversely to the operation of the second control transistor 412. The first control transistor 408 or the second control transistor 412 apply a voltage to control the first preamplifier current control transistors 404. More specifically, when the low power control 406 is high, the first control transistor 408 conducts and may apply a logic high (the resetb control 420) to the gates of first preamplifier current control transistors 404.

When the low power control 406 is low, the first control transistor 408 is turned off and control transistor 412 is turned on, thus applying a logic high (Vdd) to the gates of the first preamplifier current control transistors 404 so cause the first preamplifier current control transistors 404 to conduct and permit flow if the differential pair amplifier currents 418. This mode will bypass the dynamic power control scheme.

Figure 5:
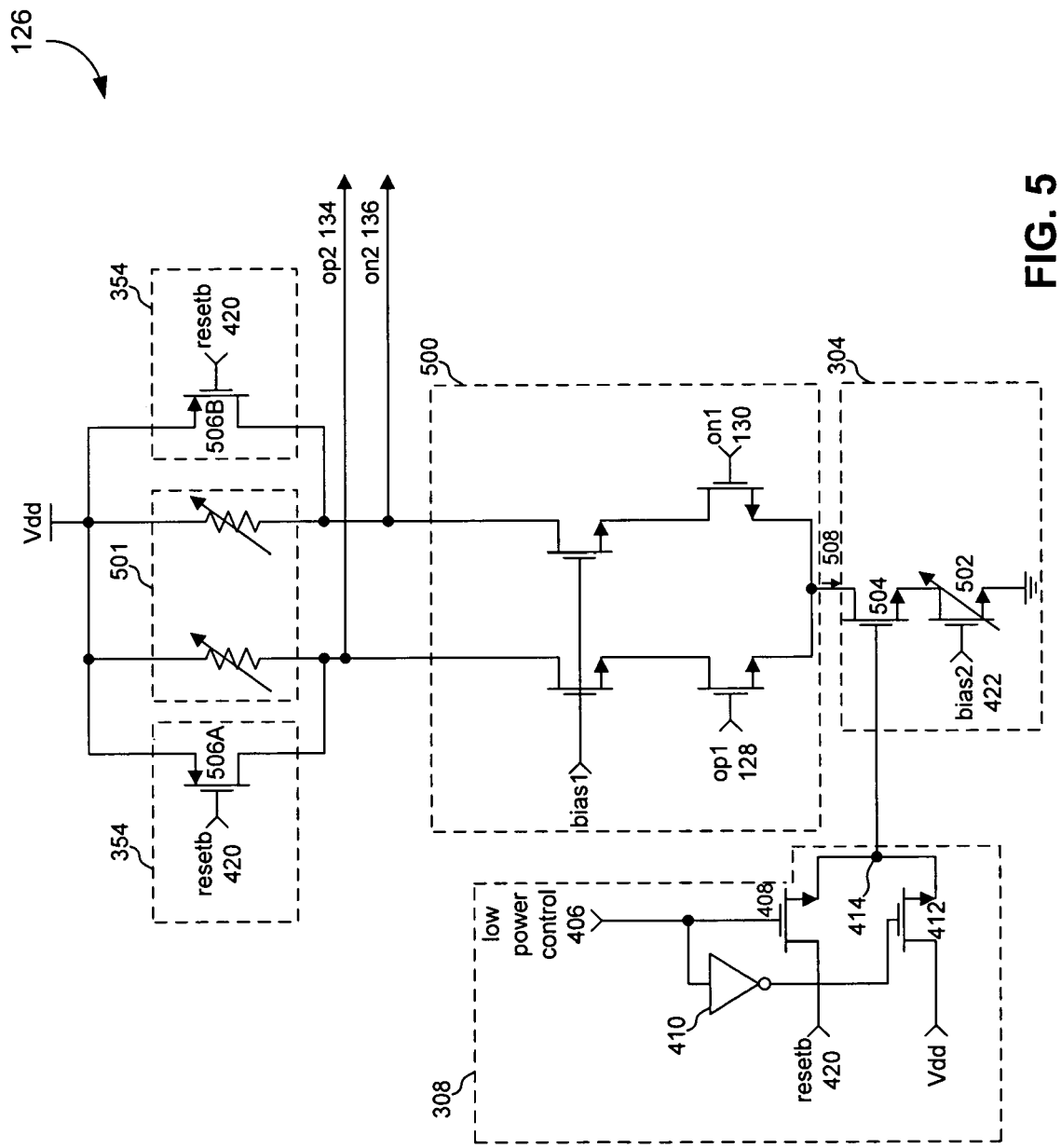
FIG. 5 is a schematic of another preamplifier stage.

FIG. 5 is a schematic of the second preamplifier 126 with a dynamic power circuit. The dynamic power circuit adjusts a gain and a bandwidth in the ADC subcircuit 302 based on clock frequency. The gain and the bandwidth are adjusted via changing a second preamplifier load 501 and a bias transistor 502. The dynamic power circuit also enables the second preamplifier 126 to amplify during the hold mode. In the track mode, the second preamplifier 126 is disabled and the ADC subcircuit 302 is reset via the control circuit 308, a pair of second preamplifier current control transistors 506A, B, and the resetb control 420. The dynamic power circuit cuts power to at least a part of the second preamplifier 126. The dynamic power circuit also shorts an output of the second preamplifier 126 to reset the output of the second preamplifier 126 so that the ADC 104 can always compare the input signal and the reference voltage from the same initial conditions, thus the inter-symbol interference (ISI) may be removed.

The second preamplifier 126 has a second preamplifier differential pair amplifier 500 coupled to a second preamplifier load 501. The second preamplifier differential pair amplifier 500 is an example of the ADC subcircuit 302. The second preamplifier differential pair amplifier 500 is coupled to a bias transistor 502 via a second preamplifier current control transistor 504. The bias transistor 502 and the second preamplifier current control transistor 504 are each an example of the power control device 304. The second preamplifier current control transistor 504 is coupled to, and controlled by, the control circuit 308. The control circuit 308 shown in FIG. 5 has a similar structure to that recited for FIG. 4. The control output node 414 is coupled to control the second preamplifier current control transistor 504.

The resetb control 420 is a signal that is input to the track and hold circuit 118. When the resetb control 420 signal is logic high, the track and hold circuit 118 is in hold mode and the second preamplifier 126 is normal operation mode. The gain and bandwidth of the second preamplifier 126 is controlled by second first preamplifier load 501 and the bias current 508 depending on the clock frequency, which could change with time. When the resetb control 420 is low, the track and hold circuit is in track mode and the second preamplifier 126 is in reset mode and turned off. The second preamplifier 126 is in reset mode because the PMOS shorting transistors 506A, 506B are turned on and both outputs are shorted to Vdd. With both the positive second preamplifier output (op2) 134 and the negative second preamplifier output (on2) 136 shorted to the same voltage source, the differential voltage between the positive second preamplifier output (op2) 134 and the negative second preamplifier output (on2) 136 is zero, thus the second preamplifier 126 is reset. When the analog to digital conversion circuit transitions from track mode to hold mode after being reset, circuits downstream from the second preamplifier 126 start processing from the same post-reset input voltage to remove inter-symbol interference (ISI). The second preamplifier 126 is in off mode because the current control transistor 504A, 504B are off if the low power control 406 is turned on.

When the second preamplifier 126 is in reset mode, the output of the differential pair amplifier 500 is substantially zero. The positive second preamplifier output (op2) 134 and the negative second preamplifier output (on2) 136 are coupled to Vdd via a pair of shorting transistors 506A, 506B. The shorting transistors 506A, 506B are an example of the power control device 304. The gates of the shorting transistors 506 are coupled to a control circuit 308 and controlled by the resetb control 420. The shorting transistors 506A, 506B are turned on by a logic low on the resetb 420 when the second preamplifier 126 is reset.

When the track-and-hold circuit 118 is in the track mode, the control circuit 308 controls the shorting transistors 506A, 506B to short the positive second preamplifier output (op2) 134 and the negative second preamplifier output (on2) 136 to Vdd. More specifically, the resetb control 420 is set to a logic low to cause the shorting transistors 506A, 506B to conduct and short the positive second preamplifier output (op2) 134 and the negative second preamplifier output (on2) 136 to Vdd. In the hold mode, the control circuit 308 controls the shorting transistors 506A, 506B to isolate the positive second preamplifier output (op2) 134 and the negative second preamplifier output (on2) 136 from Vdd, thus removing the short.

Further, in the hold mode, the control circuit 308 controls the second preamplifier current control transistor 502 to adjust a differential pair amplifier current 508. The differential pair amplifier current 508 is an example of the current 312. Together with the control of the second preamplifier load 501, the gain and bandwidth of the second preamplifier 126 can be dynamically optimized to the operating clock frequency.

In the hold mode, a signal on the low power control 406 controls the first control transistor 408 and the second control transistor 412. The inverter 410 inverts the low power control signal 406 so that the first control transistor 408 operates inversely to the operation of the second control transistor 412. Controlling the first control transistor 408 or the second control transistor 412 applies one of two voltages to control the second preamplifier current control transistor 504. More specifically, when the low power control 406 is high, the first control transistor 408 conducts and applies a logic high (the resetb control 420) to a gate of the second preamplifier current control transistor 504. When the low power control 406 is low, a logic high (Vdd) is applied to the gate of the second preamplifier current control transistor 504 so as to cause the second preamplifier current control transistor 504 to conduct and permit flow of the differential pair amplifier current 508. In the hold mode, the control circuit 308 controls the second preamplifier current control transistor 504 to resist flow of the differential pair amplifier current 508.

Figure 6:
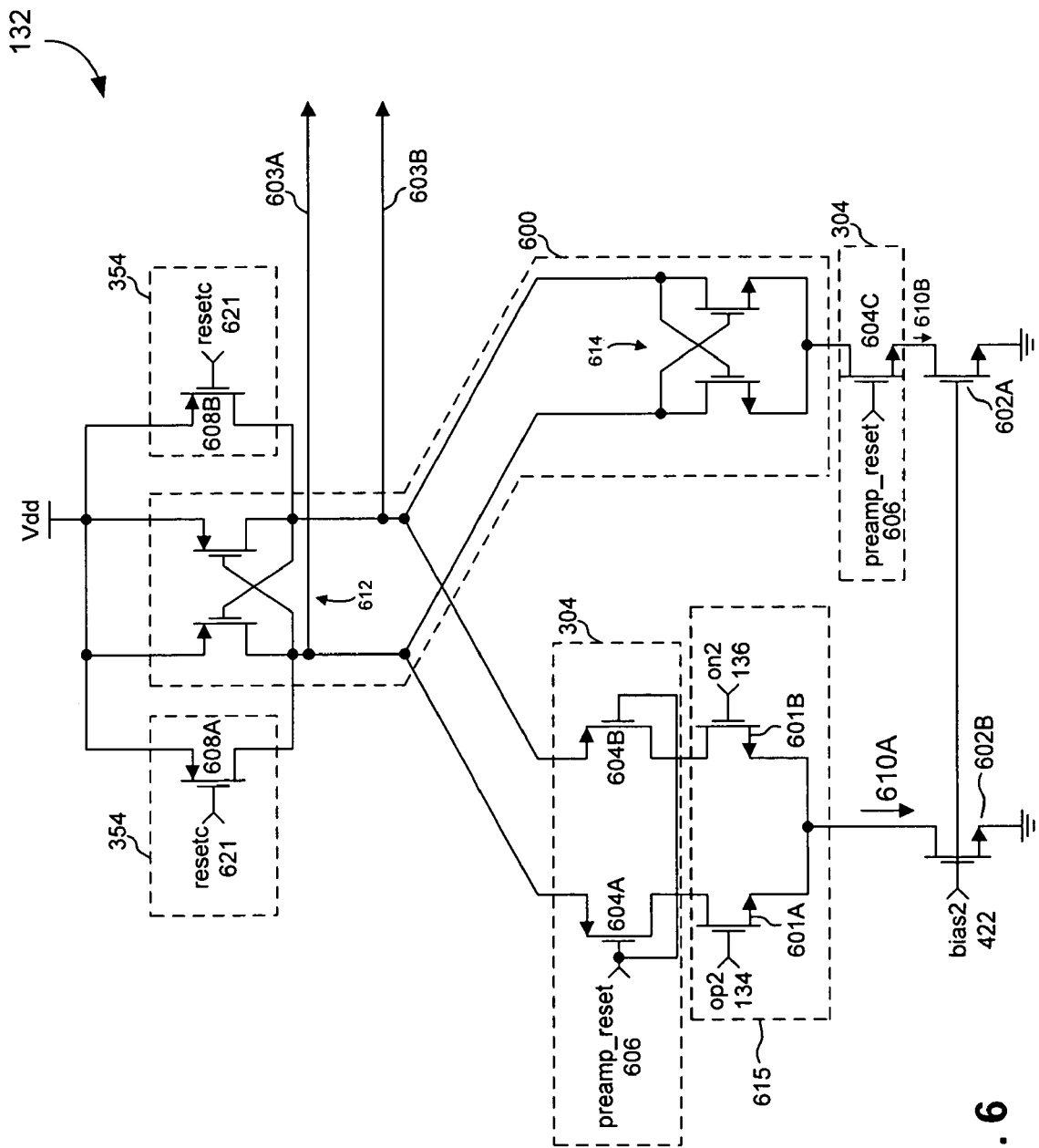
FIG. 6 is a schematic of a comparator.

FIG. 6 is a schematic of the comparator 132 with a dynamic power circuit. The dynamic power circuit controls power to at least a part of the comparator 132. The dynamic power circuit also shorts the output of the comparator 132 to reduce power consumption of a downstream circuit. The dynamic power circuit also shorts the output of the comparator 132 to reset the output of the comparator 132 so that the ADC 104 can always compare the signal and the reference voltage from the same initial conditions, thus the inter-symbol interference (ISI) may be removed.

The comparator 132 has a comparator core 600 having a first pair of cross-coupled transistors 612, a second pair of cross-coupled transistors 614, and a differential pair 601A, 601B coupled to a comparator output 603A, 603B. The comparator core 600 is an example of the ADC subcircuit 302. The comparator core 600 is coupled to Comparator bias transistors 602A, 602B and comparator current control transistors 604A-C. The comparator current control transistors 604A-C are an example of the power control device 304. The comparator current control transistor 604 is coupled to the control circuit 308 via a preamp_reset line 606. The control circuit 308 controls the comparator current control transistor 604. The comparator output 603 may be coupled to the latch 138. The latch 138 holds a latch output constant during the track mode. The comparator current control transistor 604 is controlled during the track mode to reduce a comparator core current 610A, 610B.

Figure 9:
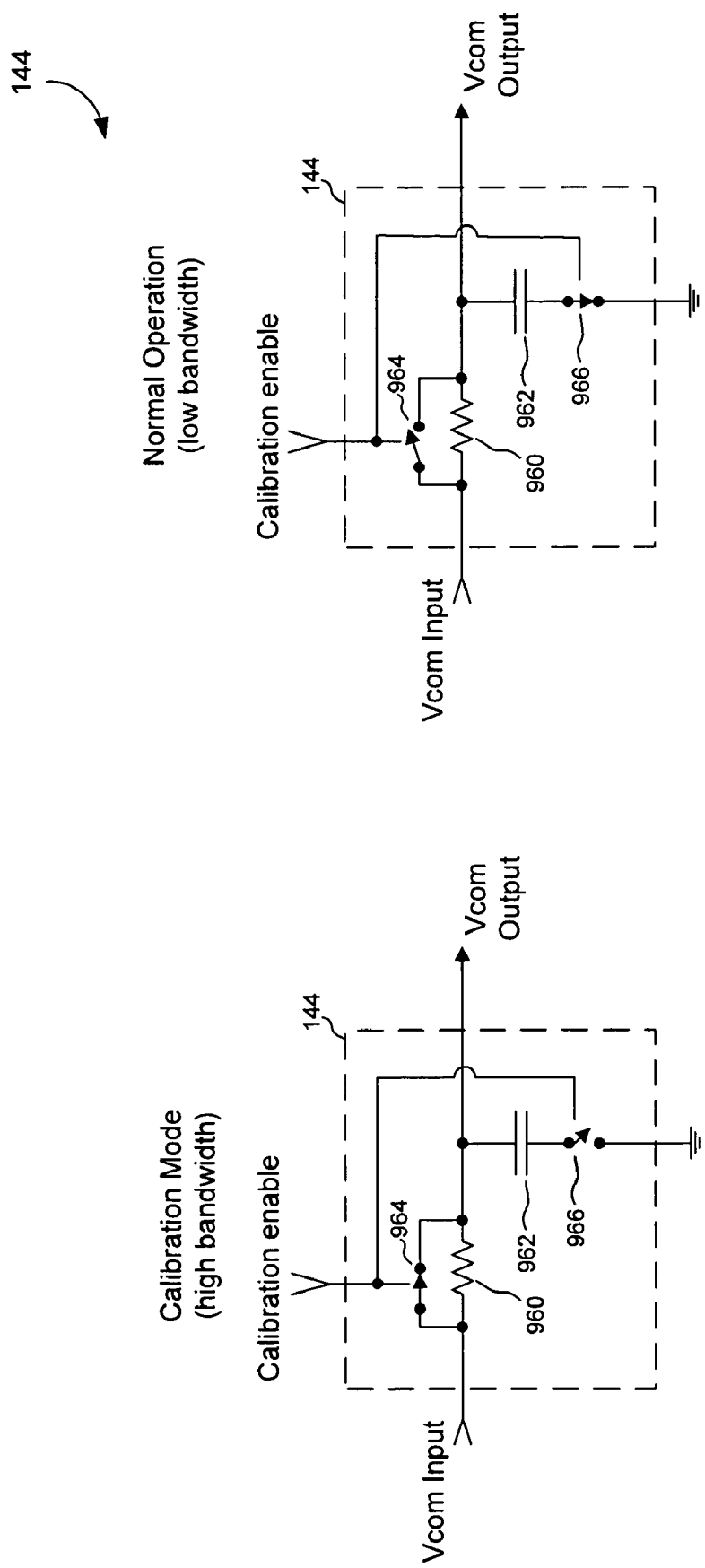
FIG. 9 is a schematic of a bandwidth-adjustable filter.

The output of the comparator core 600 is coupled to a power source, such as Vdd, via a pair of shorting transistors 608A, 608B. The shorting transistors 608 are an example of the power control device 304. The gates of the shorting transistors 608 are coupled to the control circuit 308 by a control line resetc 621. The control line resetc 621 is an example of the output of the control circuit 308. The gates of the shorting transistors 608 are controlled by the resetc control 621. The output of the comparator core 600 may be coupled to the buffer 137. FIG. 9 illustrates timing of the resetc 621 signal.

When the preamplifier is off and in reset mode, the comparator output 603A, 603B has a differential voltage of substantially zero. The comparator output 603A, 603B are coupled to Vdd via a pair of shorting transistors 608A, 608B. The shorting transistors 608 are an example of the power control device 304. The gates of the shorting transistors 608 are coupled to a control circuit 308 and controlled by the resetc control 621. The shorting transistors 608 are turned on by a logic low on the resetc 621 when the comparator 132 is reset.

Further, in the track mode, the control circuit 308 controls the comparator current control transistors 604 to reduce the comparator core currents 610. The comparator core currents 610 are an example of the current 312. A signal from the control circuit 308 on the preamp_reset line 606 controls the comparator current control transistors 604. More specifically, when the preamp_reset line 606 is high, the comparator current control transistors 604A, 604B resist current, but the comparator current control transistor 604C conducts the comparator core current 610B. When the preamp$_{13}$ reset line 606 is low, the comparator current control transistors 604A, 604B conduct to permit flow of the comparator core currents 610A, but the comparator current control transistor 604C shuts down the comparator core current 610B. The control circuit 308 also controls the comparator core currents 610A, 610B with the bias2 voltage 422 based on the operating frequency to optimize power consumption.

Figure 7:
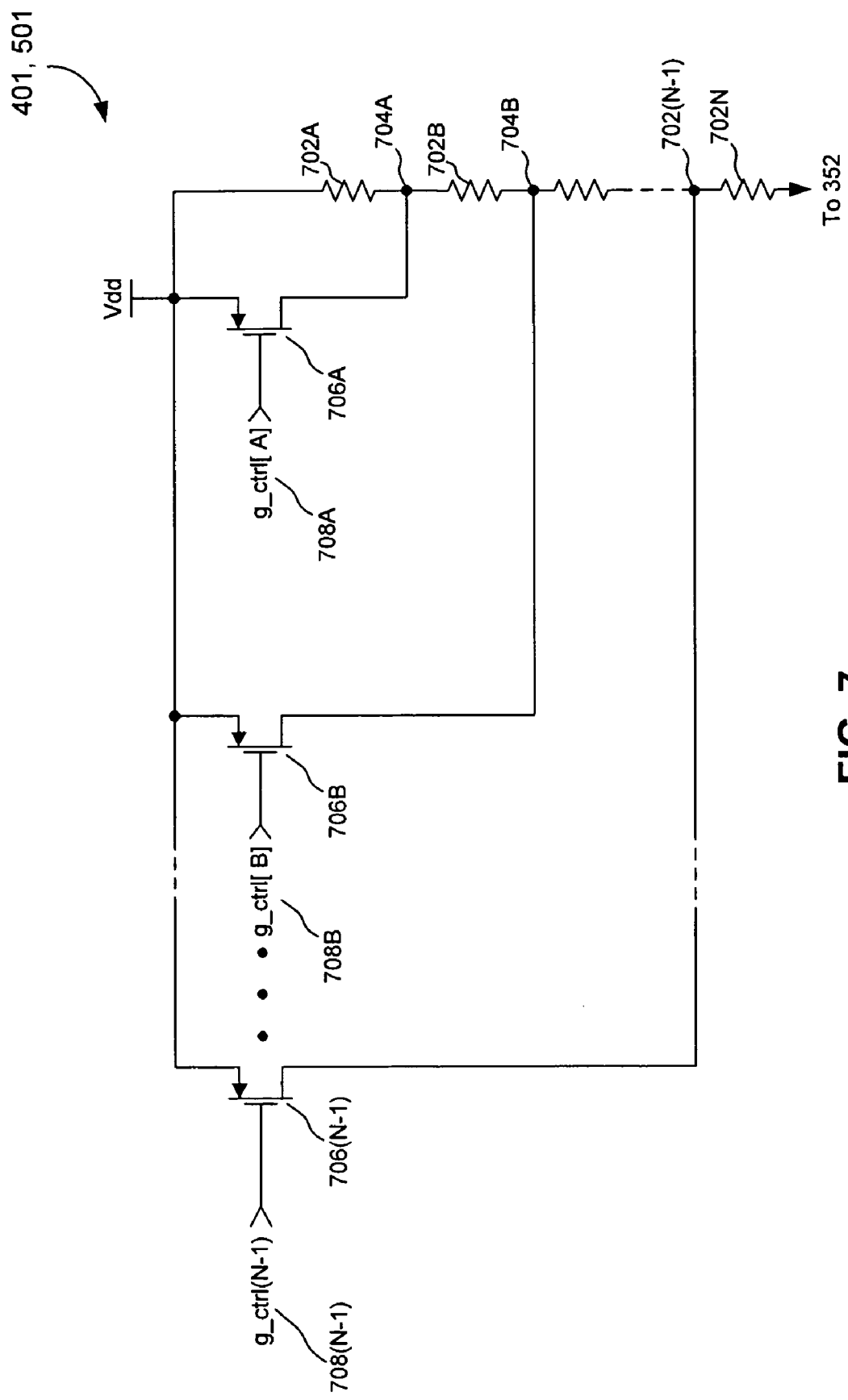
FIG. 7 is a schematic of a resistor load control circuit.

FIG. 7 is a schematic of a resistor load control circuit 401, 501. The resistor load control circuit 401, 501 illustrates one example of the first preamplifier load 401 and/or the second preamplifier load 501. The resistor load control circuit 401, 501 has at least two series-coupled resistors 702A, B, . . . , N. The resistors 702 are series-coupled via nodes 704A, B, . . . , N−1. The resistors 702 are coupled between Vdd and the ADC subcircuit output 352. A load control transistor 706A, B, . . . , N−1 is coupled between at least one of the nodes 704 and Vdd. The load control transistor 706 is coupled to a respective load control transistor control 708A, B, . . . , N−1. When a load control transistor control 708 is low, the respective load control transistor 706 conducts current so that the respective series-coupled resistor 702 decreases the first preamplifier load 401 and/or the second preamplifier load 501. When a load control transistor control 708 is high, the respective load control transistor 706 resists current flow so that the respective series-coupled resistor 702 increases the first preamplifier load 401 or the second preamplifier load 501. The load control transistor control 708 is an example of the output of the control circuit 308.

In the track mode, the control circuit 308 controls at least one load control transistor 706 to short at least one node 704 to Vdd. Shorting at least one node 704 to Vdd reduces the differential voltage of the ADC subcircuit differential output 352. Therefore, the ADC subcircuit differential output 352 is reset. In the hold mode, the control circuit 308 controls the shorting transistor 608 to remove the short of at least one node 704 to Vdd, thus the differential voltage of the ADC subcircuit differential output is increased.

Figure 8:
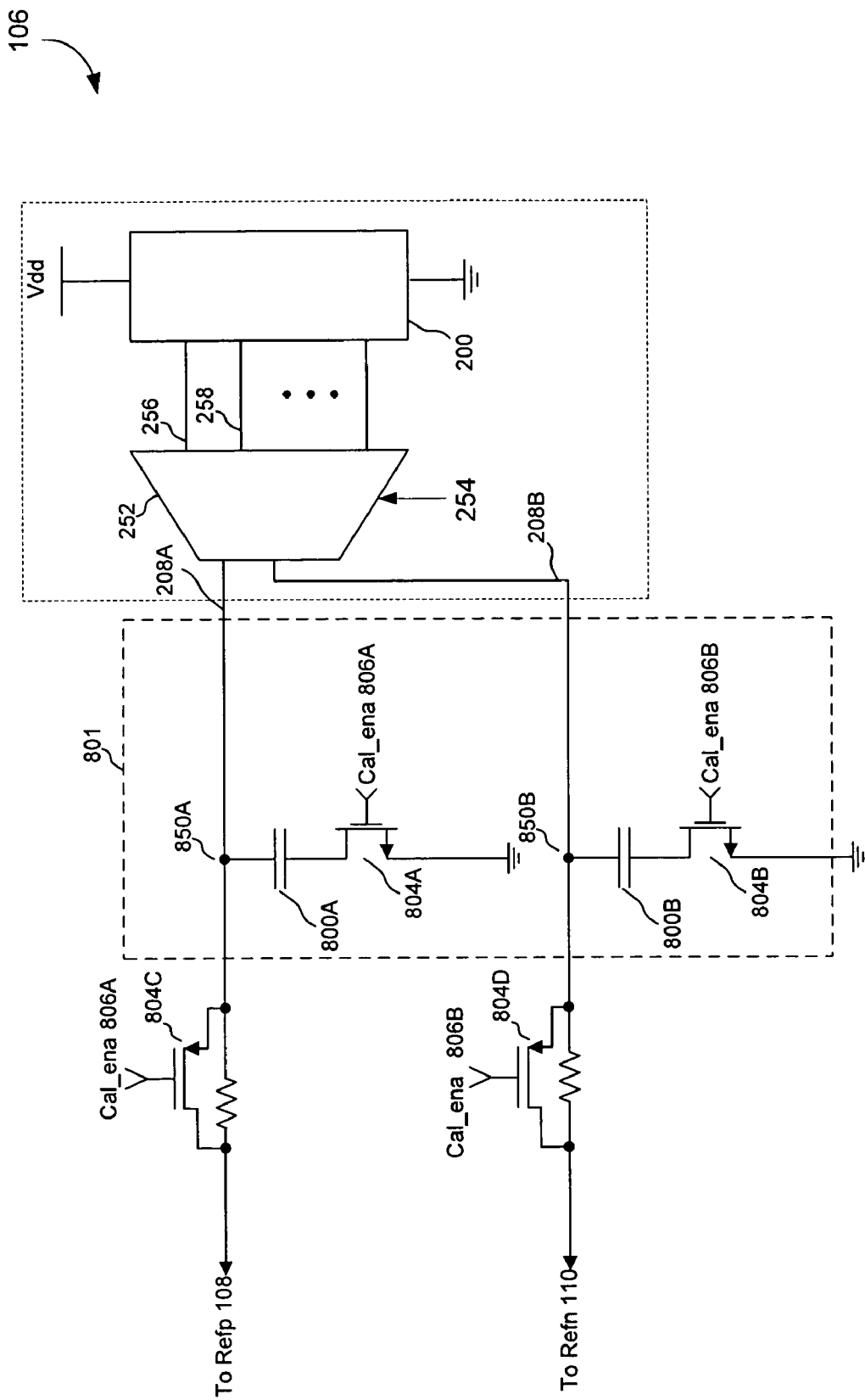
FIG. 8 is a schematic of a reference voltage supply noise suppression circuit.

FIG. 8 illustrates an exemplary reference voltage supply 106 having a reference ladder noise suppression circuit 801. The reference voltage supply outputs 208A, 208B are coupled to corresponding nodes 850A, 850B. The positive reference (Refp) 108 is coupled to the first reference voltage supply output 208A. The negative reference (Refn) 110 is coupled to the second reference voltage supply output 208B. A filter capacitor 800A is coupled to the node 850A. An isolation transistor 804A is series-coupled with the filter capacitor 800A and ground. The isolation transistor 804A is coupled to the control circuit 308 via a control line (cal_ena) 806A. A filter capacitor 800B is coupled to the node 850B. An isolation transistor 804B is series-coupled with the filter capacitor 800B and ground. The isolation transistor 804B is coupled to the control circuit 308 via a control line (cal_ena) 806B.

In the calibration mode, the control circuit 308 issues a signal on the control lines (cal_ena) 806A, 806B to cause the isolation transistors 804A, 804B to resist current flow. More specifically, the control lines (cal_ena) 806A, 806B are driven low to cutoff the transistors 806A, 806B and isolate the capacitors 800A, 800B from ground. With the filter capacitors 800A, 806B isolated, the filter capacitors 800A, 800B do not slow the passing of a calibration signal via the reference voltage supply outputs 208A, 208B. Thus, isolating the filter capacitors 800A, 800B reduces a calibration settling time.

In the normal operation mode, the control line signal causes the isolation transistors 804A, 804B to conduct and short the filter capacitors 800A, 800B to ground. When the filter capacitors 800A, 800B are shorted to ground, noise present on the reference voltage supply outputs 208A, 208B shorts to ground via the filter capacitors 800A, 800B and the isolation transistors 804A, 804B. This suppresses reference ladder noise.

FIG. 9 illustrates a schematic of the bandwidth-adjustable filter 144. The bandwidth-adjustable filter 144 shown is a low-pass filter. A resistance 960 is in series with a bandwidth-adjustable filter input 961 and a bandwidth-adjustable filter output 963. A filter capacitance 962 is coupled between the bandwidth-adjustable filter output 963 and ground. A first switch 964 is coupled in parallel with the resistance 960. A second switch 966 is coupled in series with the filter capacitance 962. The first switch 964 is coupled to a calibration enable control. The second switch 966 is coupled to the calibration enable control.

During calibration, the bandwidth-adjustable filter 144 has a high bandwidth. The calibration enable control signals the first switch 964 to close and short the resistance 960. The calibration enable control also signals the second switch 966 to open and isolate the capacitance 962. This disables the low-pass filter to provide a high bandwidth path for a signal.

During normal operation, such as the analog to digital conversion mode, the bandwidth-adjustable filter 144 has a low bandwidth. The calibration enable control signals the first switch 964 to open. Thus, the resistance 960 resists current flow. The calibration enable control also signals the second switch 966 to close. This enables the capacitance 962 to store a charge. Thus, the low-pass filter is enabled to provide a low bandwidth path for a signal.

Method for Reducing ADC Power Consumption

Figure 10:
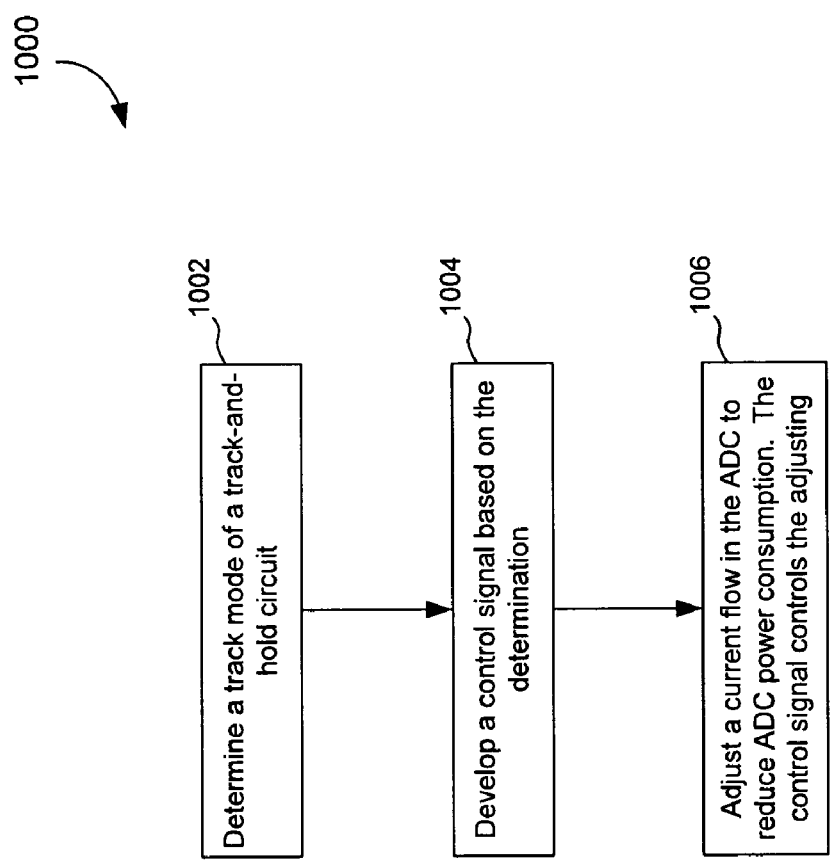
FIG. 10 illustrates a method for managing power in an analog-to-digital converter.

FIG. 10 illustrates an exemplary method 1000 for reducing power consumption by an ADC having a track-and-hold circuit coupled to a comparator via a preamplifier. The preamplifier has a load.

In step 1002, a track mode of the track-and hold circuit is determined. A bit storage circuit may be determined to be maintaining a constant output. A control circuit may monitor the track-and-hold circuit to develop a control signal. In step 1004, a control signal is developed based on the step 1002 determination. In step 1006, a current flow in the ADC is adjusted to reduce ADC power consumption. The control signal controls the adjusting. The current flow may be reduced in the preamplifier and/or the comparator. The current flow in the ADC may be adjusted by selectively coupling a resistance to vary the load. The adjusting may short the load to ground or a power source. The adjusting may limit current flow in a differential pair of transistors.

The method 1000 may also suppress reference ladder noise during the track mode of the track-and-hold circuit. During the track mode, the control signal controls a transistor to couple a reference voltage tap to ground via a capacitor. The capacitor reduces alternating current components present at the reference voltage tap by shorting noise to ground.

Further, the method 1000 may also have a step for reducing a settling time of the ADC during ADC calibration. The control signal controls a transistor to reduce current flow between a reference voltage tap and ground via a capacitor. In other words, the transistor is cutoff so as to isolate the transistor. Reducing the current flow reduces a settling time of the ADC during ADC calibration.

The exemplary method 1000 may also select a transistor control voltage source with the control signal. The control signal controls a control voltage transistor to select a voltage source to be coupled to the current control transistor. The voltage source coupled to the current control transistor varies the current control transistor.

Method for Reducing a Calibration Settling Time

Figure 11:
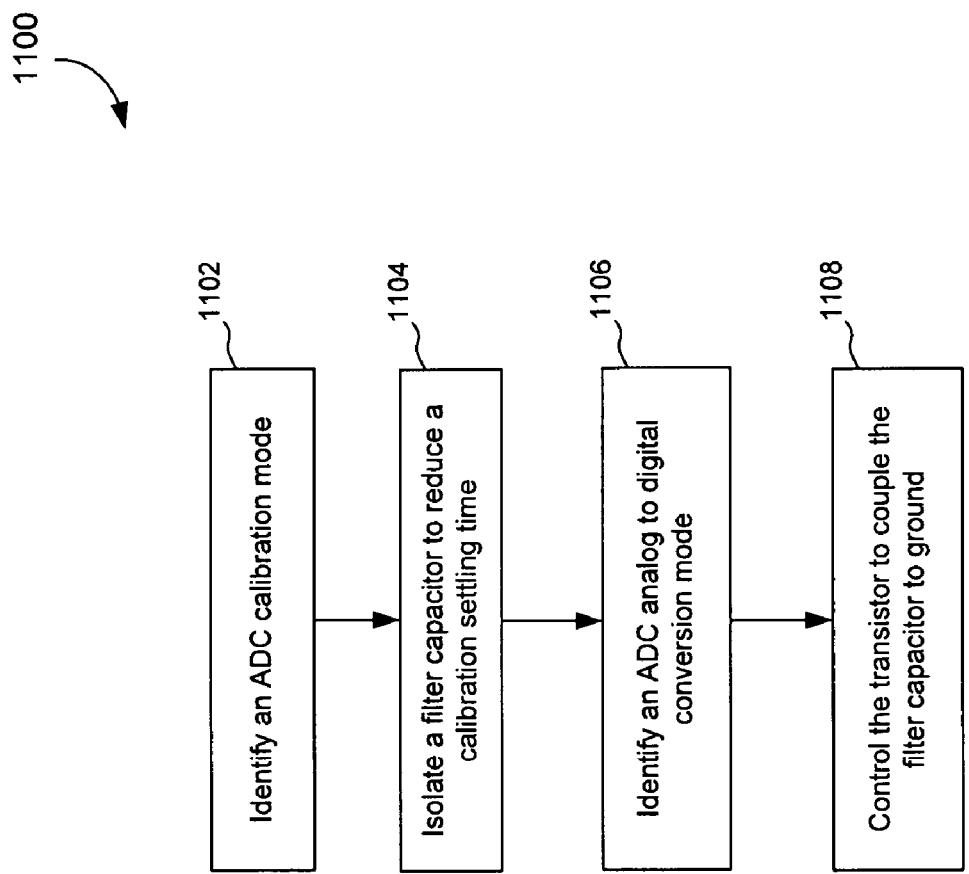
FIG. 11 illustrates a method for reducing ADC settling time during ADC calibration.

FIG. 11 illustrates a method 1100 for reducing a settling time of the ADC during ADC calibration. In step 1102, a calibration mode is identified. A control circuit may be used to identify the calibration mode. In step 1104, a filter capacitor is isolated to reduce a calibration settling time. The filter capacitor is isolated during the calibration mode. The filter capacitor may be isolated by controlling an isolation transistor so as to cutoff current flow, thereby isolating the filter capacitor from ground. In step 1106, an analog to digital conversion mode is identified. In step 1108, the isolation transistor is controlled to conduct current and short the filter capacitor to ground. The filter capacitor is shorted to ground during the analog to digital conversion mode.

Figure 12:
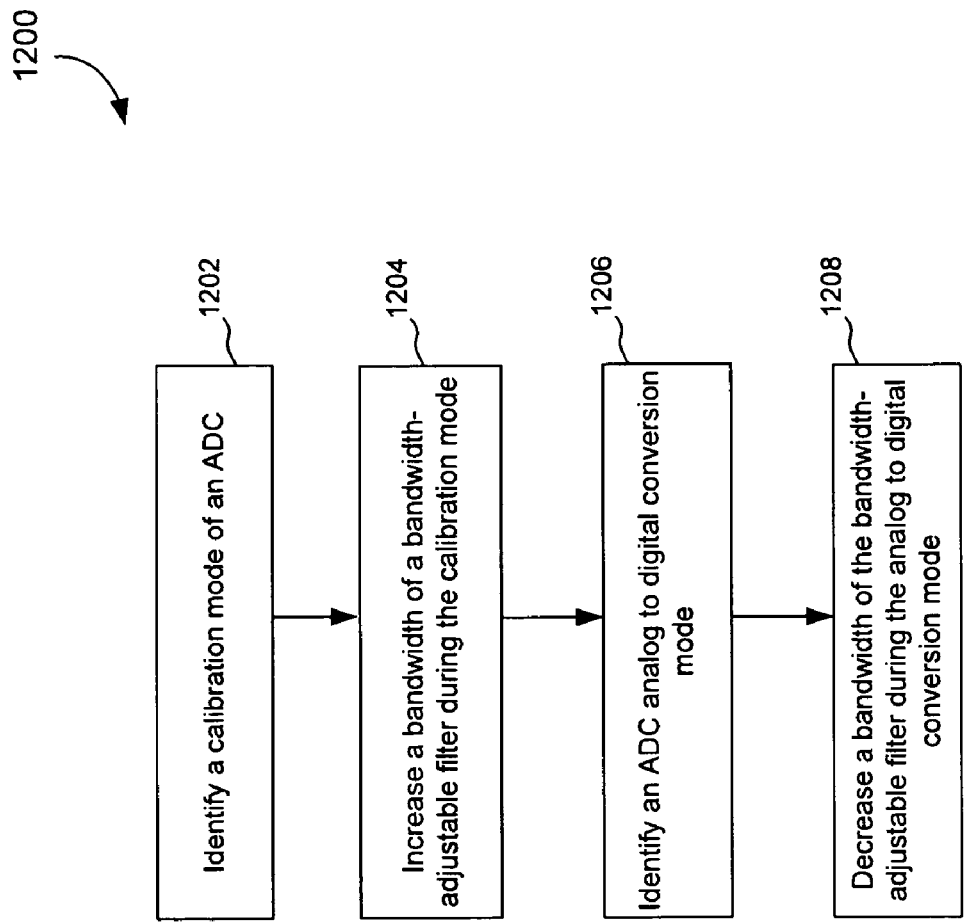
FIG. 12 illustrates a method for varying a calibration signal bandwidth.

FIG. 12 illustrates a method 1200 for varying a calibration signal bandwidth in an analog-to-digital converter (ADC). The calibration signal is passed through a bandwidth-adjustable filter. In step 1202, a calibration mode is identified. In step 1204, a bandwidth of the bandwidth-adjustable filter is increased during the calibration mode. The bandwidth may be increased by disabling a low-pass filter. In step 1206, an analog to digital conversion mode is identified. In step 1208, the bandwidth of the bandwidth-adjustable filter is decreased during the analog to digital conversion mode. The bandwidth may be decreased by low-pass filtering the calibration signal.

Figure 13:
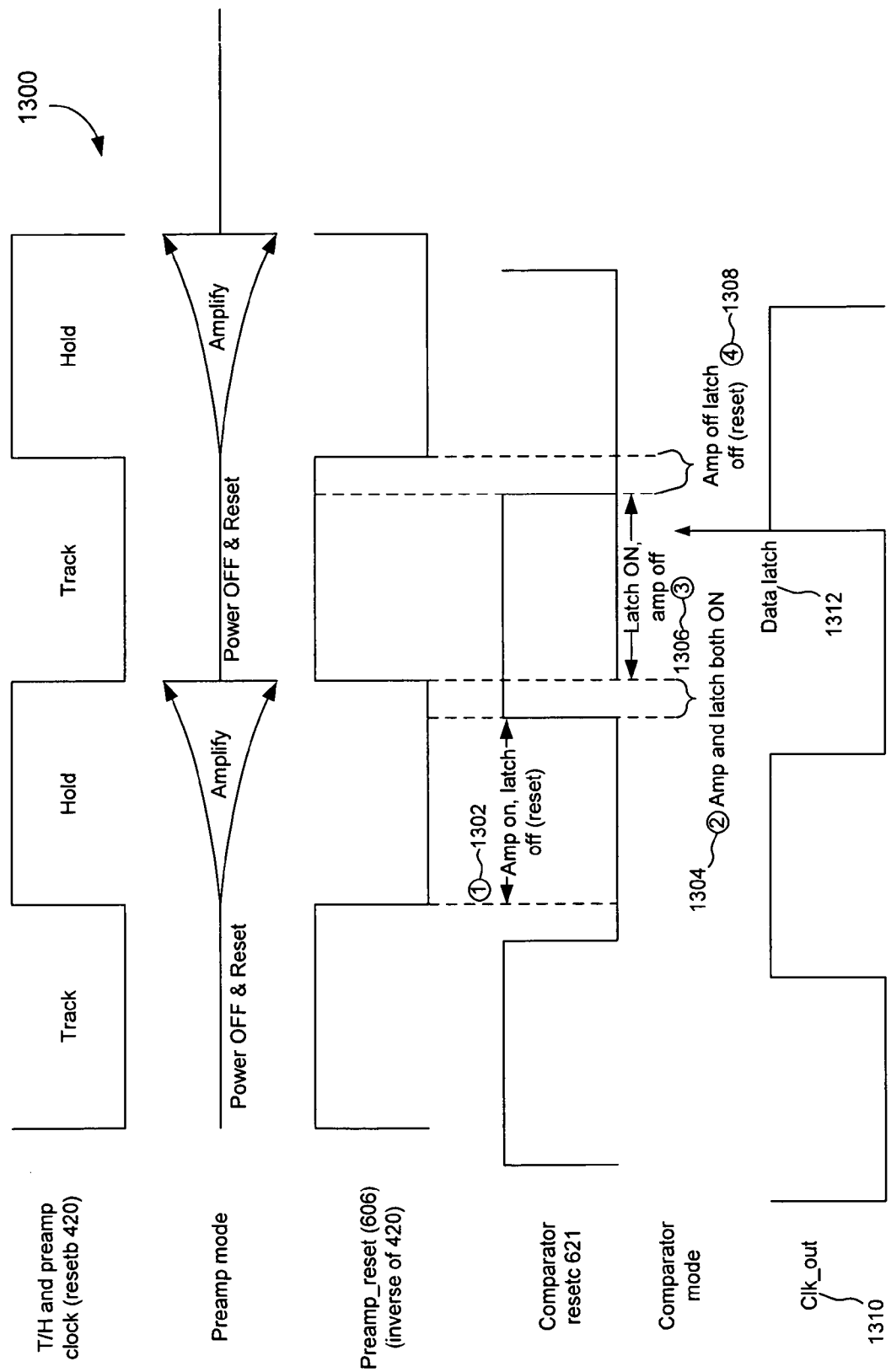
FIG. 13 illustrates exemplary timing of control signals and circuit modes.

FIG. 13 illustrates exemplary timing of control signals and circuit modes 1300. Four phases of preamplifier and comparator operation are shown in FIG. 13.

During a first phase 1302, both of the preamplifiers 120, 126 are on and the comparator latch is off. In the first preamplifier 120, the PMOS shorting transistors 416A, 416B resist current flow because the resetb 420 is high. The NMOS first preamplifier current control transistors 404A, 404B conduct because the low power control 406 is high and the resetb 420 is high. In the second preamplifier 126, the PMOS second preamplifier current control transistors 506A, 506B resist current flow because the resetb 420 is high. The NMOS second preamplifier current control transistor 504 conducts because the low power control 406 is high and the resetb 420 is high. In the comparator 132, the PMOS shorting transistors 608A, 608B conduct to reset the latch because the resetc 621 is low. The PMOS comparator current control transistors 604A, 604B conduct because the preamp_reset 606 is low. The NMOS comparator current control transistor 604C resists current flow because the preamp_reset 606 is low. During the first phase 1302, within comparator 132, the amplifier formed by the differential pair 601A, 601B is on and the latch formed by the first pair of cross-coupled transistors 612 and the second pair of cross-coupled transistors 614 is off. During the first phase 1302, a small output signal is amplified by a comparator amplifier 615 across a resistance provided by the PMOS shorting transistors 608A, 608B. The amplified signal is present at the comparator output 603A, 603B.

During a second phase 1304, both of the preamplifiers 120, 126 and the comparator amplifier 615 are on. The preamplifiers 120, 126 are in hold mode and the signal from the track and hold circuit 118 is amplified by the preamplifiers 120, 126. The comparator amplifier 615 and the first pair of cross-coupled transistors 612 are turned on to amplify the positive second preamplifier output (op2) 134 and the negative second preamplifier output (on2) 136. During the second phase 1304, the amplification gain is large due the positive feedback in the latch. The first pair of cross-coupled transistors 612 are activated because the PMOS shorting transistors 608A, 608B are turned off. The PMOS comparator current control transistors 604A, 604B conduct because the preamp_reset 606 is low. The NMOS comparator current control transistor 604C resists current flow because the preamp_reset 606 is low. Thus, within comparator 132, the comparator amplifier 615 is on and the latch formed by the first pair of cross-coupled transistors 612 is on, but the second pair of cross-coupled transistors 614 are off.

During a third phase 1306, the track and hold circuit 118 is in track mode and both of the preamplifiers 120, 126 are off and in reset mode to conserve power and the first pair of cross-coupled transistors 612 and the second pair of cross-coupled transistors 614 are on to pull the comparator output 603A, 603B signal to power or ground. The second pair of cross-coupled transistors 614 are on because the preamp_reset control signal 606 goes high. In the first preamplifier 120, the PMOS shorting transistors 416A, 416B conduct because the resetb 420 is low. The NMOS first preamplifier current control transistors 404A, 404B resist current flow because the low power control 406 is high and the resetb 420 is low. In the second preamplifier 126, the PMOS second preamplifier current control transistors 506A, 506B conduct because the resetb 420 is low. The NMOS second preamplifier current control transistor 504 resists current flow because the low power control 406 is high and the resetb 420 is low. In the comparator 132, the PMOS shorting transistors 608A, 608B resist current flow because the resetc 621 is high. The PMOS comparator current control transistors 604A, 604B resist current flow because the preamp_reset 606 is high. The NMOS comparator current control transistor 604C conducts because the preamp_reset 606 is high. Thus, within comparator 132, the comparator amplifier 615 is off and the latch formed by the first pair of cross-coupled transistors 612 and the second pair of cross-coupled transistors 614 is on. During the third phase 1306, the clock output signal (Clk_out) 1310 triggers the flip-flop 140 to latch data 1312 the ADC output 135 before the end of the third phase 1306 since the signal was amplified to the maximum value in this phase.

During a fourth phase 1308, both of the preamplifiers 120, 126 are off to conserve power and the comparator latch is in reset mode. In the first preamplifier 120, the PMOS shorting transistors 416A, 416B conduct because the resetb 420 is low. The NMOS first preamplifier current control transistors 404A, 404B resist current flow because the low power control 406 is high and the resetb 420 is low. In the second preamplifier 126, the PMOS second preamplifier current control transistors 506A, 506B conduct because the resetb 420 is low. The NMOS second preamplifier current control transistor 504 resists current flow because the low power control 406 is high and the resetb 420 is low. In the comparator 132, the PMOS shorting transistors 608A, 608B conduct because the resetc 621 is low. The PMOS comparator current control transistors 604A, 604B resist current flow because the preamp_reset 606 is high. The NMOS comparator current control transistor 604C conducts because the preamp_reset 606 is high. During the third phase, the flip-flop 140 remains latched to maintain the ADC output 135. Thus, within comparator 132, the comparator amplifier 615 is off and the latch formed by the first pair of cross-coupled transistors 612 and the second pair of cross-coupled transistors 614 is also off.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. An analog to digital converter (ADC), comprising:
a reference voltage supply having an output; and
an isolation transistor series-coupled with a filter capacitor between said reference voltage supply output and ground,
wherein said isolation transistor isolates said filter capacitor during calibration of the ADC.

2. The ADC of claim 1, further comprising:
a multiplexer having an input and an output,
wherein said reference voltage supply includes a reference ladder having a plurality of resistors coupled in series via at least one node,
wherein said multiplexer input is coupled to one of said nodes, and
wherein said multiplexer output is coupled to said reference voltage supply output.

3. The ADC of claim 1, wherein at least a part of said ADC is deposited on a substrate.

4. The ADC of claim 1, further comprising:
a resistance series-coupled with said reference voltage supply output; and
a second isolation transistor coupled in parallel with said resistance.

5. The ADC of claim 4, wherein said second isolation transistor is configured to short said resistance during calibration of the ADC.

6. The ADC of claim 1, wherein said reference voltage supply output is configured to provide a positive reference voltage and a negative reference voltage.

7. The ADC of claim 1, wherein said reference voltage supply output is configured to provide a common mode calibration voltage.

8. A method for reducing a calibration settling time in an analog-to-digital converter (ADC) having a filter capacitor, wherein the filter capacitor and an isolation transistor are coupled in series between a reference voltage supply output and ground, comprising:
identifying a calibration mode of the ADC; and
isolating the filter capacitor with the isolation transistor during said calibration mode.

9. The method of claim 8, wherein said isolating comprises controlling the isolation transistor.

10. The method of claim 8, further comprising:
identifying an ADC analog to digital conversion mode; and
controlling the isolation transistor to short the filter capacitor to ground during said analog to digital conversion mode.

11. A method for varying a calibration signal bandwidth in an analog-to-digital converter (ADC), wherein said calibration signal is passed through a bandwidth-adjustable filter, comprising:
identifying a calibration mode of the ADC; and
increasing a bandwidth of said bandwidth-adjustable filter during said calibration mode to vary the calibration signal bandwidth in the ADC.

12. The method of claim 11, wherein said increasing comprises disabling a low-pass filter.

13. The method of claim 11, further comprising:
identifying an analog to digital conversion mode; and
decreasing a bandwidth of said bandwidth-adjustable filter during said analog to digital conversion mode.

14. The method of claim 13, wherein said decreasing comprises low-pass filtering the calibration signal.

* * * * *